US007064381B2

(12) United States Patent
Koh

(10) Patent No.: US 7,064,381 B2
(45) Date of Patent: Jun. 20, 2006

(54) NON-VOLATILE MEMORY DEVICE HAVING UPPER AND LOWER TRENCHES AND METHOD FOR FABRICATING THE SAME

(75) Inventor: Kwan-Ju Koh, Kyunggido (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/026,826

(22) Filed: Dec. 28, 2004

(65) Prior Publication Data

US 2005/0139895 A1 Jun. 30, 2005

(30) Foreign Application Priority Data

Dec. 30, 2003 (KR) .................... 10-2003-0100957

(51) Int. Cl.
*H01L 29/788* (2006.01)
(52) U.S. Cl. .................. 257/315; 257/321; 438/259
(58) Field of Classification Search ............... 257/315, 257/321; 438/259
See application file for complete search history.

(56) References Cited

U.S. PATENT DOCUMENTS

| 5,429,970 A * | 7/1995 | Hong ......................... 438/259 |
| 2002/0110984 A1* | 8/2002 | Liou et al. ................... 438/259 |
| 2005/0116279 A1* | 6/2005 | Koh ........................... 257/314 |

* cited by examiner

*Primary Examiner*—Jack Chen
(74) *Attorney, Agent, or Firm*—Andrew D. Fortney

(57) ABSTRACT

Non-volatile memory device, and method for fabricating the same are disclosed. By forming floating gate trenches in memory regions and filling the trenches with floating gate material, a step height of a with the floating gate/ONO/control gate structure is reduced to the level of a gate in a logic block, and the upper gate structures do not cause a topology imbalance. By forming a tunnel insulating film in the floating gate trenches, edges of the floating gate are in contact with the tunnel insulating film and included in an effective charge area of the device. By reducing the step height of the nonvolatile memory device and including edges of the floating gate in the effective charge area, the completed device can effectively perform its regular operations, such as erasure, programming, and reading.

20 Claims, 6 Drawing Sheets

NON-VOLATILE MEMORY DEVICE HAVING UPPER AND LOWER TRENCHES AND METHOD FOR FABRICATING THE SAME

CROSS-REFERENCE TO RELATED APPLICATIONS

This application claims the benefit of Korean Application No. P2003-0100957 filed on Dec. 30, 2003, which is hereby incorporated by reference as if fully set forth herein.

BACKGROUND OF THE INVENTION

1. Field of the Invention

The present invention relates to non-volatile memory devices, and more particularly, to a non-volatile memory device in which a step height in a structure is reduced, which has a floating gate pattern/Oxide-Nitride-Oxide pattern (hereafter called as "ONO pattern")/control gate pattern formed by burying the floating gate pattern and a tunnel insulating film below a semiconductor substrate surface, and an entire edge of the floating gate pattern is induced to make natural and extensive contact with the tunnel insulating film; and a method for fabricating the same.

2. Discussion of the Related Art

Recently, as demands increase sharply for non-volatile memories, such as flash memories, which can electrically program or erase data, geometries of structures of the non-volatile memory undergo many changes.

Referring to FIG. 1, a conventional non-volatile memory generally includes a tunnel insulating film 3 on an entire surface of a semiconductor substrate 1 having an active region defined by a device isolating film 2, a floating gate pattern 4 on the tunnel insulating film 3, an ONO pattern 5 on the floating gate pattern 4, and a control gate pattern 6 on the ONO pattern 5. In this instance, there are source/drain diffusion layers 7, and LDD (Lightly Doped Drain) regions on both sides of a structure composed of the floating gate pattern/the ONO pattern/the control gate pattern 4, 5, and 6.

As described before, in above configuration, a non-volatile memory device has a memory block having the structure in which the floating gate pattern/the ONO pattern/the control gate pattern 4, 5, and 6 are stacked in succession. However, different from the memory block, a logic block gate pattern (not shown) in the vicinity of the memory block of the same semiconductor substrate 1 has a different (and generally fewer) series of steps, typically omitting the floating gate/ONO patterns 4 and 5. That is, under the related art configuration, as far as no extra measures are taken, the structures on the semiconductor substrate 1 are generally involved in an unbalanced topology due to differences in the numbers of layers in the different gate patterns in the memory block and the logic block.

Of course, if no extra measures are taken under this situation, upper structures of the memory block, and the logic block may exhibit unstable operation due to the topology imbalance, which may lead to failure of the completed device in regular operations (e.g., such as erasure, programming, and reading).

Moreover, in the related art configuration, the floating gate pattern 4 has the tunnel insulating film 3 only on an underside of the floating gate pattern 4 itself, limiting an effective charging area of the device to only the underside area of the floating gate pattern 4 where the tunnel insulating film 3 is in substantial contact. If no extra measures are taken in this situation, the completed device may fail in regular operations.

SUMMARY OF THE INVENTION

Accordingly, the present invention is directed to a non-volatile memory device, and a method for fabricating the same that substantially obviates one or more problems due to limitations and disadvantages of the related art.

An object of the present invention is to provide a non-volatile memory device, and a method for fabricating the same, in which a series of floating gate trenches are formed in regions where floating gates are to be formed ("nonvolatile memory regions" or "floating gate regions"), and floating gates are filled in the trenches, to reduce a step height of a floating gate/insulator/control gate structure to a step height level of a gate pattern in a logic region, so that upper structures of the gates on the semiconductor substrate are not in an unbalanced topology.

Another object of the present invention is to provide a non-volatile memory device, and a method for fabricating the same, in which a floating gate pattern is buried in (or formed at or below an upper surface of) a semiconductor substrate, to reduce a step height of a floating gate/insulator (e.g., ONO)/control gate structure, and subsequently prevent the upper gate structures from causing operation failures resulting from step imbalances between a memory block and a logic block, so that the completed device can perform a series of regular operations given to the device, such as erasure, programming, and reading.

Another object of the present invention is to provide a non-volatile memory device, and a method for fabricating the same, in which a series of floating gate trenches are formed in floating gate regions, and a tunnel insulating film is formed in the floating gate trenches, so that an entire edge (e.g., more than one surface) of the floating gate deposited in the trenches are in contact with the tunnel insulating film, which may result in increasing an effective charge area of the device, significantly.

A further object of the present invention is to provide a non-volatile memory device, and a method for fabricating the same, in which a floating gate panel pattern and a tunnel insulating film are buried (e.g., formed at or below an upper surface of a semiconductor substrate) to enlarge an effective charge area of the corresponding floating gate device, so that the completed device can effectively perform a series of regular operations, such as erasure, programming, and reading.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a non-volatile memory device includes an upper trench having a depth in an active region of a semiconductor substrate, a lower trench in a bottom of the upper trench and in communication with the upper trench, a passivation pattern on the corner surfaces of the upper trench, a tunnel insulating film on an inside surface of the lower trench (which may be only in the lower trench), a floating gate inside the upper and lower trenches, in contact both with the tunnel insulating film and the passivation pattern, and an insulator layer (e.g., an Oxide-Nitride-Oxide or ONO pattern) and a control gate on the floating gate in succession.

In another aspect of the present invention, a method for fabricating a non-volatile memory device, includes the steps of forming an upper trench in an active region of a semiconductor substrate, forming a passivation pattern on opposite corner surfaces of the upper trench, forming a lower trench in a bottom of the upper trench to retain portions of corner surfaces of the upper trench and enable communication with the upper trench, forming a tunnel insulating film on an inside surface of the lower trench (preferably selectively), filling the upper and lower trenches with a floating gate so as cover the tunnel insulating film and the passivation pattern, and successively forming an insulator (e.g., an ONO layer) and a control gate on the floating gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
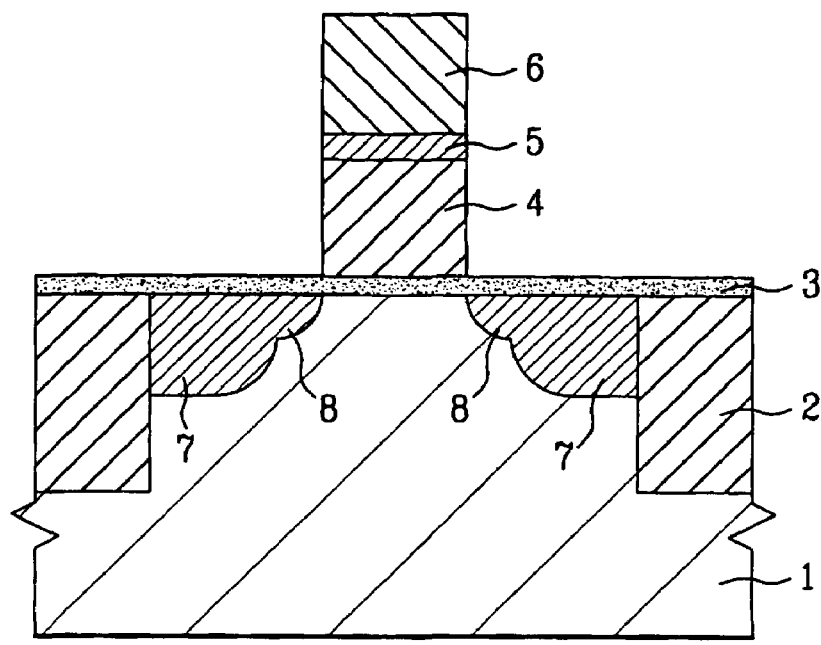
FIG. 1 illustrates a section of an example of a conventional non-volatile memory device.
Figure 2:
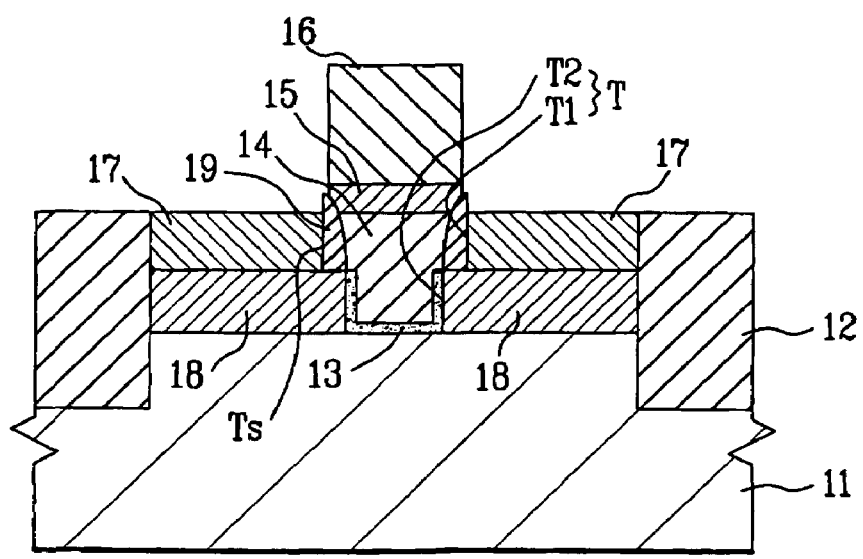
FIG. 2 illustrates a section of a non-volatile memory device in accordance with a preferred embodiment of the present invention.

Referring to FIG. 2, the non-volatile memory device in accordance with a preferred embodiment of the present invention includes an upper trench T1 having a predetermined depth in an active region of a semiconductor substrate 11, a lower trench T2 in the bottom of the upper trench T1 such that portions of corner surfaces Ts of the upper trench T1 remain, a tunnel insulating film 13 (which may be selectively formed) on an inside surface of the lower trench T2, a floating gate 14 filling an inside space of the upper and lower trenches T1 and T2 and in contact with, for example, the tunnel insulating film 13, and an insulator (e.g., ONO) layer 15 and a control gate 16 on the floating gate 14 in succession. In this instance, on opposite sides of the upper trench T1, there are source/drain diffusion layers 17, and on opposite sides of the lower trench T2, there are lightly doped source/drain extension layers (LDDs) 18.

There is a passivation pattern 19 on the edge Ts of the upper trench T1 configured to electrically insulate the source/drain diffusion layer 17 from the floating gate 14. In this case, the passivation pattern 19 has a surface covered (e.g., is in contact) with the floating gate 14 in the upper trench T1. Passivation pattern 19 may be in the shape of a conventional spacer, and may comprise one or more conventional insulator materials such as silicon oxide, silicon nitride, silicon oxynitride, etc.

As described before, in the present non-volatile memory device configuration, the floating gate 14 of the memory block is in the upper and lower trenches T1 and T2, and thus, is at or below the upper surface of substrate 11 (and specifically, the upper surface of source/drain diffusion layer 17). Of course, the structure of floating gate 14 is novel and is totally different from the related art floating gate structure.

Since the floating gate of the memory block of the related art is simply on the semiconductor substrate, leading a height of the floating gate/ONO/control gate structure substantially greater than that of the logic block gate, the uppermost gate structures over the semiconductor substrate cause a topology imbalance due to the difference in the number of layers in the different gate structures. However, in the present invention, since the upper and lower trenches T1 and T2 are formed in a floating gate region or nonvolatile memory region of the substrate 11, the step height of the present structure having the floating gate/insulator (e.g., ONO)/control gate pattern 14, 15, and 16 is naturally reduced to the same level as the step height of the gate pattern of the logic block or region, so that, when the present invention is implemented, the upper gate structures over the semiconductor substrate 11 do not cause an unbalanced topology, despite the different number of layers in the gate patterns of the memory block (i.e., the floating gate or nonvolatile memory region) and the logic block. Of course, if operational malfunctions that may result from an unbalanced topology between the memory block and the logic block are prevented in advance, the completed device can effectively perform its given operations, such as erasure, programming, and reading, regularly.

Furthermore, the related art floating gate pattern having the tunnel insulating film only on an underside thereof limits an effective charge area of the device to the underside of the floating gate pattern, where the floating gate pattern is substantially in contact with the tunnel insulating film. However, in the present invention, because the floating gate is formed in the lower trench T2, lined by the tunnel insulating film 13, an edge of the floating gate pattern 14 in the lower trench T2 is in natural and extensive contact with the tunnel insulating film 13 and is in closer proximity to the channel region 20 of substrate 11, the effective charge area of the device of the present invention can include an edge region of the floating gate 14, such that, when the present invention is implemented, the completed device can effectively perform its regular operations, such as erasure, programming, and reading. Also, as will be explained in greater detail below, the thickness of tunnel oxide layer 13 is generally greater along the sidewall of the lower trench than along the bottom of the lower trench, thereby enabling an improvement and/or reduction in short channel and/or hot electron effects.

A method for fabricating the foregoing non-volatile memory device in accordance with a preferred embodiment of the present invention will be described in detail.

Figure 3A:
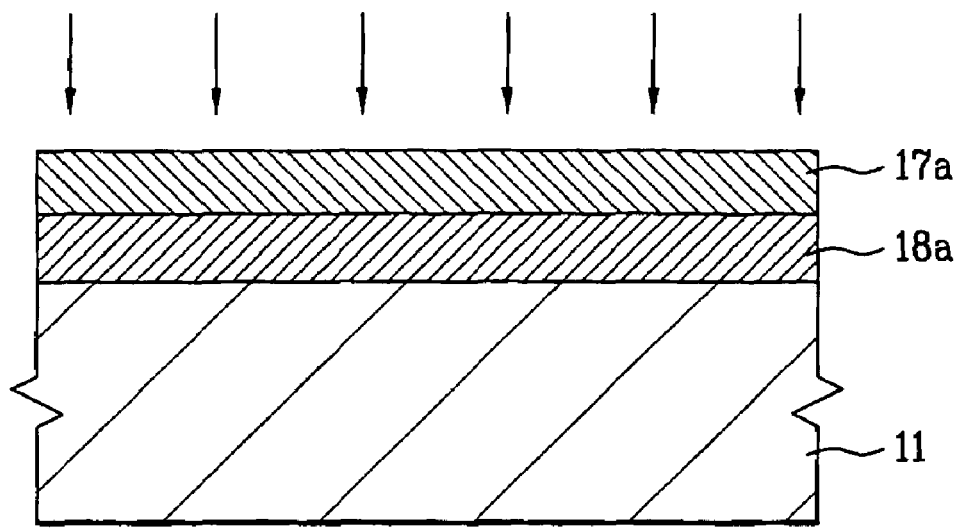
FIGS. 3A through 3H illustrate sections showing the steps of a method for fabricating a non-volatile memory device in accordance with a preferred embodiment of the present invention.

Referring to FIG. 3A, one or more impurity ion injection steps are performed, to form a lightly doped impurity layer 18a for an LDD on an entire surface of a semiconductor substrate 11. Thereafter, one or more impurity ion injection steps are performed additionally, to form a heavily doped impurity layer 17a for source/drain diffusions/terminals on the lightly doped impurity layer 18a for the LDDs. Alternatively, heavily doped impurity layer 17a may be deposited by, for example, PE-CVD or epitaxial growth of a doped silicon material from appropriate feed gases (e.g., silane mixed with phosphine or $BF_3$ in a known ratio) onto substrate 11 already having a lightly doped impurity layer 18a thereon.

Figure 3B:
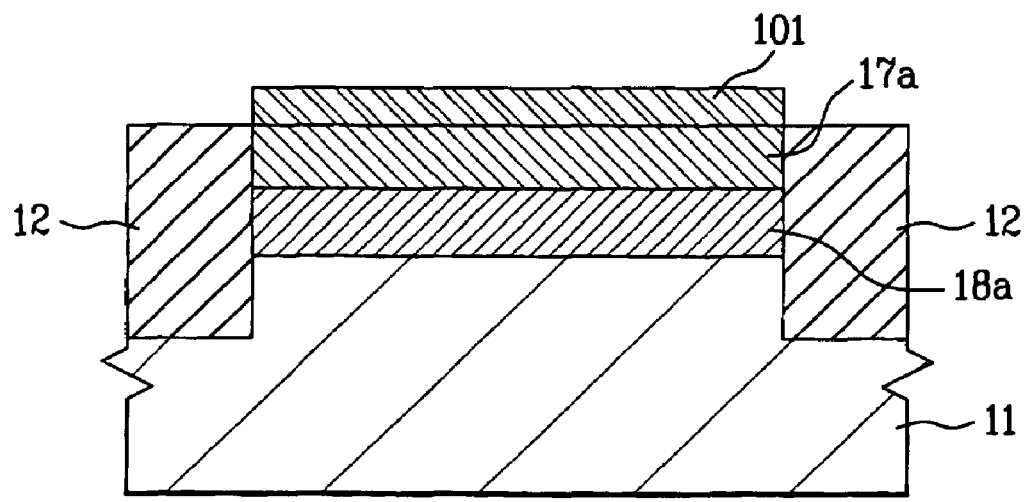

Then, as shown in FIG. 3B, in the present invention, a Shallow Trench Isolation (STI) process is performed using a sacrificial film pattern 101 to form a device isolation film (or structures) 12 for defining an active region of the semiconductor substrate 11. Then, the sacrificial film pattern 101 is removed from a surface of the semiconductor substrate 11.

Figure 3C:
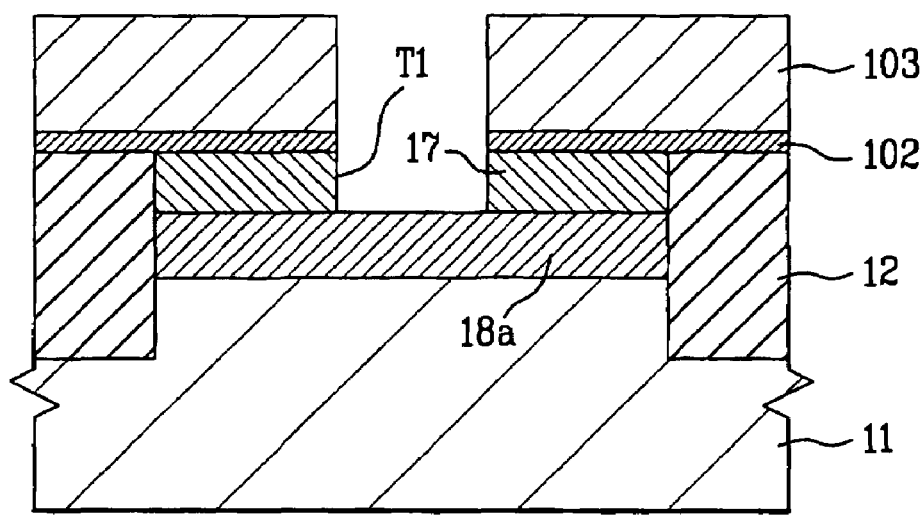

Then, as shown in FIG. 3C, in the present invention, a thermal oxidation process is performed to form substrate protection film 102 (for example, a thermal silicon dioxide film) on an entire surface of the semiconductor substrate 11. Thereafter, a photoresist pattern 103 is formed to exposing a region of the semiconductor substrate 11 where the floating gate is to be formed therein. Then, the semiconductor substrate 11 is etched using the photoresist pattern 103 as an etch mask, to form an upper trench T1 having a predetermined depth in the semiconductor substrate 11. At the time of formation of the upper trench T1, a portion of the heavily doped impurity layer 17a for the source/drain diffusion layer on the semiconductor substrate 11 is removed, to define a series of source/drain diffusion layers (or terminals) 17 on sides of the upper trench T1. The upper trench T1 is preferably etched to a depth about equal to the target depth for implanting ions for heavily doped impurity layer 17a. Then, the photoresist film pattern 103 is removed from the substrate protection film 102.

Figure 3D:
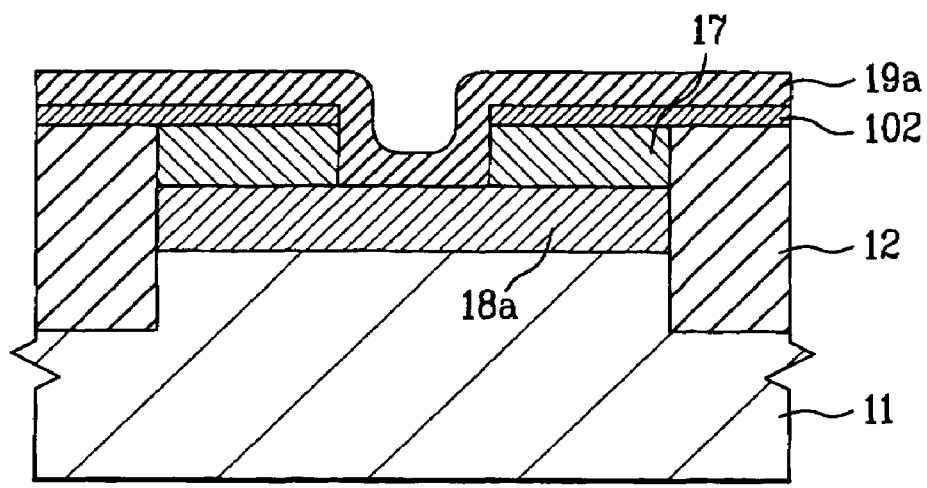
Figure 3E:
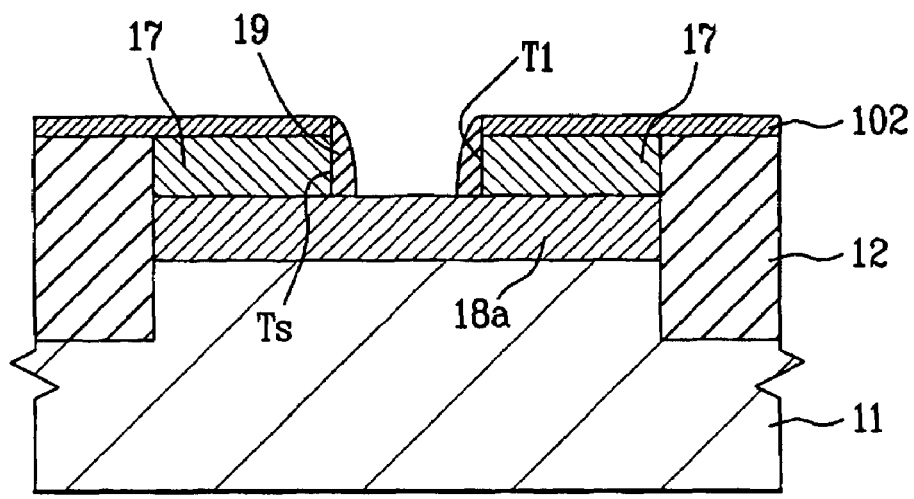

Referring to FIG. 3D, upon completion of formation of the upper trench T1 and the source/drain diffusion layers 17 in the semiconductor substrate 11, a blanket deposition process is performed to form a nitride layer 19a on an entire surface of the semiconductor substrate 11 inclusive of the substrate protection film 102, to a thickness in a range of 200 Å~500Å. Then, the nitride layer 19a is anisotropically etched (for example, by reactive ion etching) to form, as shown in FIG. 3E, one pair of passivation spacers 19, which occupy opposite corner surfaces Ts of the upper trench T1 spaced a predetermined distance from each other. This predetermined distance is generally about the width of the trench T1 minus the thickness of the nitride layer 19. In this case, the passivation pattern serves to insulate the subsequently formed floating gate 14 from the source/drain diffusion layer 17.

Figure 3F:
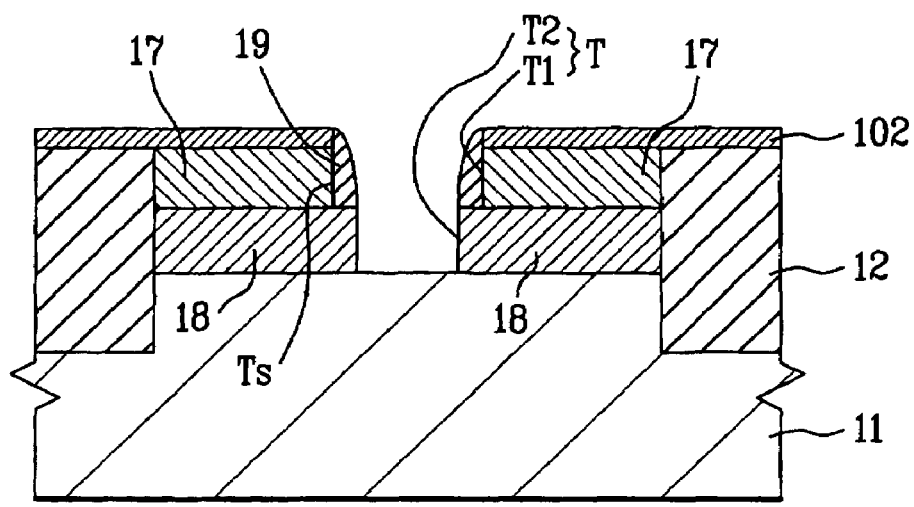

Then, in the present invention, a dry etching process (for example, reactive ion etching) is performed to form a lower trench T2 in the bottom surface of the upper trench T1, as shown in FIG. 3F. Lower trench T2 digs into the bottom of the semiconductor substrate so as to be in communication with the upper trench T1, while preserving the passivation pattern 19 at the corner surfaces Ts of the upper trench T1. In this case, the lower trench T2 has a width roughly equal to the predetermined distance between the passivation spacers 19 in upper trench T1.

During formation of the lower trench T2, a portion of the lightly doped impurity layer 18a for an LDD on the semiconductor substrate 11 is removed, to define the LDDs 18 on sides of the lower trench T2, naturally. Thus, lower trench T2 preferably has a depth equal to or about the same as the target depth for LDD 18 ion implantation. Each of the upper and lower trenches T1 and T2 may have a depth of from about 500 Å to about 2000 Å. Preferably, each of the upper and lower trenches T1 and T2 have a depth of from about 1000 Å to about 1500 Å. However, in one advanced embodiment, the upper and lower trenches T1 and T2 have a total or combined depth of from about 1000 Å to about 1500 Å.

Figure 3G:
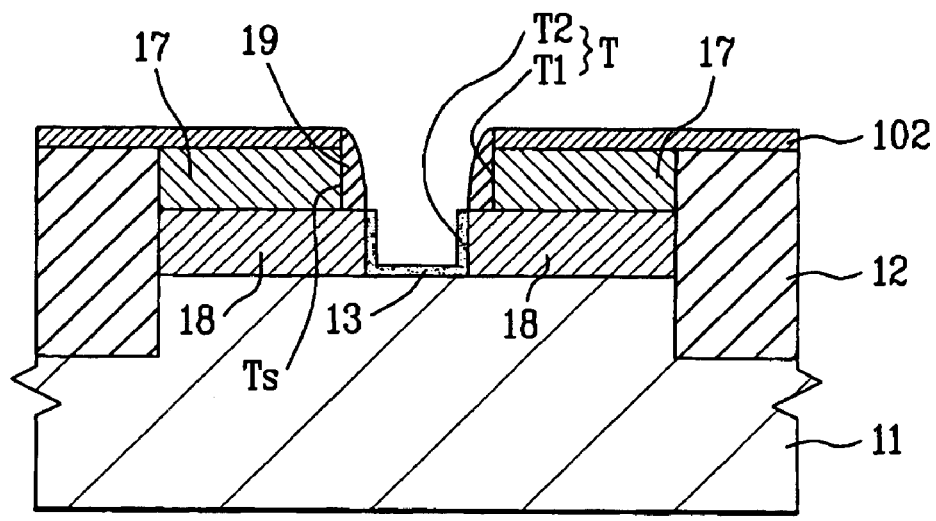

Then, referring to FIG. 3G, a thermal oxidation process is performed to form a tunnel insulating film 13 (for example, a tunnel oxide film) on an inside surface of the lower trench T2. In this case, the substrate protection film 102, and the passivation pattern 19 prevent oxide layers from growing unnecessarily in regions other than the lower trench T2. Since thermally grown oxide has a greater volume than the corresponding silicon from which it is grown, tunnel insulating film 13 formed by thermal oxidation grows over the bottom surface of insulating spacers 19, thereby preventing any possible exposure of a subsequently formed floating gate to source/drain layer 18. The thickness of tunnel oxide layer 13 is also generally greater along the sidewall of the lower trench than along the bottom of the lower trench, thereby enabling a reduction in short channel and/or hot electron effects for the nonvolatile memory device.

Alternatively, tunnel insulating film 13 may comprise a conformally deposited silicon oxide film, which may prevent inadvertent shorting of source/drain diffusion regions 18 to floating gate 14 at the corner near Ts. However, the density/quality of such conformally deposited oxide films are not as good as thermal oxide films for tunnel insulator film functionality, so conformally deposited oxide films should be densified if used. In any case, deposited oxide films are less preferred than thermal oxide films for tunnel insulating film 13.

Figure 3H:
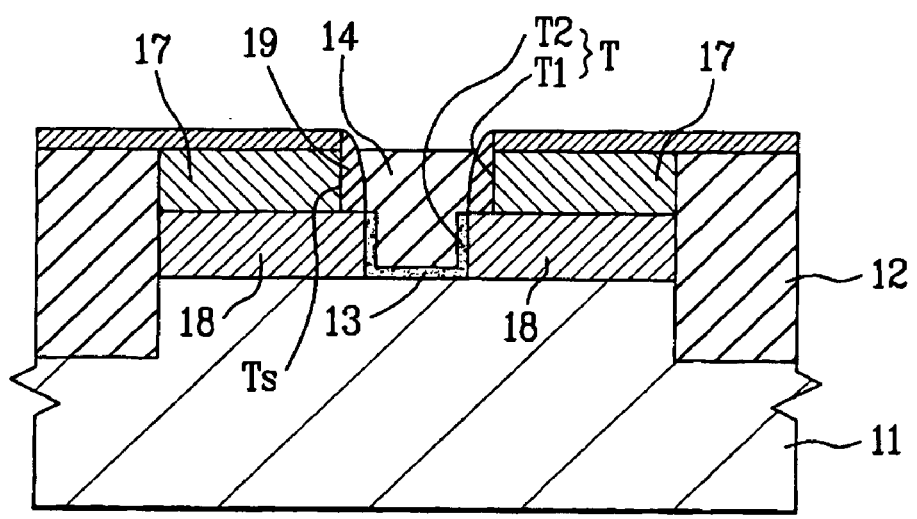

Then, a blanket and/or conformal polysilicon deposition process is performed to fill the upper and lower trenches T1 and T2 (and cover substrate protection film 102), and the polysilicon layer is etched back or polished (e.g., by CMP) to form, as shown in FIG. 3H, a floating gate 14 which substantially covers the passivation pattern 19 and the tunnel insulation film 13, and substantially fills the upper and lower trenches T2 and T1. It is also possible from this point in the method to complete the nonvolatile memory device using a standard logic process. Thus, the gate insulator and control gate may be formed simultaneously with the gate insulator and gate of transistors in logic areas of the substrate (e.g., chip, die or wafer).

Figure 3I:
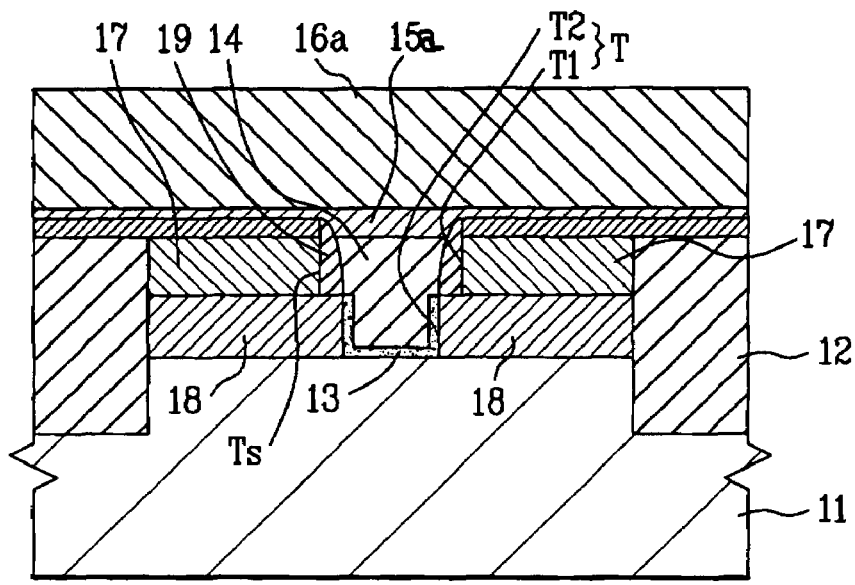

Next, referring to FIG. 3I, a series of chemical vapor deposition processes may be performed in succession, to form an insulator material layer 15a on the floating gate 14 and a control gate material layer 16a (for example, a polysilicon layer having a thickness in a range of from about 1000 Å to about 2000 Å) on insulator material layer 15a. In this case, the insulator material layer 15a may comprise a single layer (e.g., of silicon oxide or silicon oxynitride) or an ONO structure, as described elsewhere herein. When the insulator material layer 15a contains a silicon oxide layer in contact with floating gate 14, the silicon oxide layer may be formed by deposition or thermal growth. Furthermore, the control gate material layer 16a may further comprise a conventional dopant in a conventional amount or concentration.

Figure 3J:
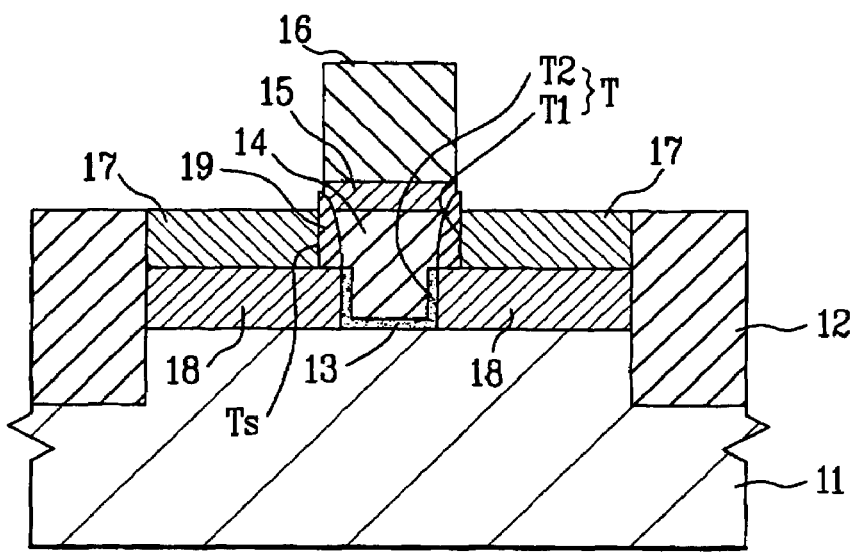

Then, referring to FIG. 3J, through a photolithographic patterning step and one or more etching steps, the material layer 15b, the control gate material layer 16a, and the substrate protection layer 102 are etched to form a stacked structure comprising floating gate 14, insulator layer 15, and control gate 16 over the active region.

As has been described, the non-volatile memory device, and method for fabricating the same have the following advantages. By forming floating gate trenches in nonvolatile memory regions and filling the trenches with the floating gate material, a step height of a memory structure having the floating gate/ONO/control gate pattern is reduced to the same level as a gate pattern in a logic block, and the upper structures of the memory and logic gates do not cause a topology imbalance resulting from a different number of layers in the different gates.

Also, by burying a floating gate in a semiconductor substrate, to reduce a step height of a floating gate/ONO/control gate structure, and subsequently preventing failures in device operation caused by step height imbalance of memory block transistors and logic block transistors, the present nonvolatile memory device can effectively perform its regular operations, such as erasure, programming, and reading.

By forming floating gate trenches and a tunnel insulating film in the floating gate trenches, edges of the floating gate are in contact with the tunnel insulating film and included in an effective charge area of the device, thereby further enabling the present nonvolatile memory device to perform its regular operations effectively, such as erasure, programming, and reading.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A non-volatile memory device comprising:
    an upper trench in a heavily doped region of a semiconductor substrate having a depth;
    a lower trench in a bottom of the upper trench, in a lightly doped drain (LDDs) of the semiconductor substrate below the heavily doped region and in communication with the upper trench, wherein portions of corner surfaces of the upper trench remain;
    a passivation pattern on the corner surfaces of the upper trench;
    a tunnel insulating film on an inside surface of the lower trench;
    a floating gate inside the upper and lower trenches and in contact with the tunnel insulating film and the passivation pattern;
    a gate insulator layer on the floating gate; and
    a control gate on the gate insulator layer.

2. The non-volatile memory device as claimed in claim 1, wherein said heavily doped region comprises a source/drain diffusion layer on opposite sides of the upper trench.

3. The non-volatile memory device as claimed in claim 1, wherein said LDDs are on opposite sides of the lower trench.

4. The non-volatile memory device as claimed in claim 1, wherein the passivation pattern comprises a nitride spacer.

5. The non-volatile memory device as claimed in claim 1, wherein the passivation pattern has a thickness of from about 200Å to about 500Å.

6. The non-volatile memory device as claimed in claim 2, wherein said source/drain diffusion layer has a target depth about equal to the depth of the upper trench.

7. The non-volatile memory device as claimed in claim 6, wherein the source/drain diffusion layer has a target depth of from about 500Å to about 2000Å.

8. The non-volatile memory device as claimed in claim 3, wherein said LDDs have a target depth about equal to a depth of the lower trench.

9. The non-volatile memory device as claimed in claim 8, wherein the LDD have a target depth of from about 1000Å to about 4000Å.

10. The non-volatile memory device as claimed in claim 1, wherein the tunnel insulating film comprises a bottom portion along the bottom of the lower trench and sidewall portions along respective sidewalls of the lower trench.

11. The non-volatile memory device as claimed in claim 10, wherein the sidewall portions of the tunnel insulating film have a greater thickness than the bottom portion of the tunnel insulating film.

12. The non-volatile memory device as claimed in claim 1, wherein the tunnel insulating film comprises a thermally grown oxide.

13. The non-volatile memory device as claimed in claim 2, wherein the tunnel insulating film and passivation pattern are configured to prevent exposure of the floating gate to the source/drain diffusion layer.

14. The non-volatile memory device as claimed in claim 2, wherein the passivation pattern is configured to electrically insulate the source/drain diffusion layer from the floating gate.

15. The non-volatile memory device as claimed in claim 14, wherein the passivation pattern has a surface in contact with the floating gate.

16. The non-volatile memory device as claimed in claim 1, wherein the gate insulator layer comprises a silicon oxide layer.

17. The non-volatile memory device as claimed in claim 16, wherein the gate insulator layer comprises an Oxide-Nitride-Oxide (ONO) pattern.

18. The non-volatile memory device as claimed in claim 1, wherein the gate insulator layer contacts the passivation pattern.

19. The non-volatile memory device as claimed in claim 1, wherein the floating gate substantially fills the upper and lower trenches.

20. The non-volatile memory device as claimed in claim 1, wherein the floating gate comprises polysilicon.

* * * * *